United States Patent
Zhu et al.

(10) Patent No.: US 10,236,386 B2
(45) Date of Patent: Mar. 19, 2019

(54) VERTICAL HETERO- AND HOMO-JUNCTION TUNNEL FIELD-EFFECT TRANSISTORS

(71) Applicant: The Board of Trustees of the University of Illinois, Urbana, IL (US)

(72) Inventors: Wenjuan Zhu, Urbana, IL (US); Shang-Chun Lu, Urbana, IL (US); Mohamed Mohamed, Cambridge, MA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 15/843,766

(22) Filed: Dec. 15, 2017

(65) Prior Publication Data
US 2018/0204953 A1    Jul. 19, 2018

Related U.S. Application Data

(63) Continuation of application No. 15/835,070, filed on Dec. 7, 2017, now abandoned.
(Continued)

(51) Int. Cl.
| | | |
|---|---|---|
| *H01L 21/00* | (2006.01) | |
| *H01L 29/00* | (2006.01) | |
| *H01L 29/786* | (2006.01) | |
| *H01L 29/24* | (2006.01) | |
| *H01L 21/02* | (2006.01) | |
| *H01L 29/15* | (2006.01) | |
| *H01L 29/66* | (2006.01) | |
| *H01L 29/267* | (2006.01) | |
| *H01L 29/739* | (2006.01) | |

(52) U.S. Cl.
CPC .. *H01L 29/78642* (2013.01); *H01L 21/02521* (2013.01); *H01L 21/02568* (2013.01); *H01L 29/155* (2013.01); *H01L 29/24* (2013.01); *H01L 29/267* (2013.01); *H01L 29/66969* (2013.01); *H01L 29/7391* (2013.01); *H01L 29/78648* (2013.01)

(58) Field of Classification Search
CPC ......... H01L 21/02568; H01L 21/02521; H01L 21/8221; H01L 21/823487; H01L 29/78642; H01L 29/78648; H01L 29/24; H01L 29/267; H01L 29/155; H01L 29/66969
See application file for complete search history.

(56) References Cited

U.S. PATENT DOCUMENTS 7,306,981 B2 * 12/2007 Kuwabara ........... H01L 27/1214
                                                          438/166
8,629,428 B2    1/2014 Verhulst et al.
(Continued)

OTHER PUBLICATIONS

Lee et al., "Atomically thin p-n junctions with van der Waals heterointerfaces", 2014, Nature nanotechnology, vol. 9, pp. 676-681, Sep. 2014.*
(Continued)

*Primary Examiner* — Nikolay K Yushin
(74) *Attorney, Agent, or Firm* — Benesch, Friedlander, Coplan & Aronoff LLP

(57) ABSTRACT

The present disclosure provides vertical hetero- and homo-junction tunnel FET (TFET) based on multi-layer black phosphorus (BP) and transition metal dichalcogenides.

22 Claims, 6 Drawing Sheets

Related U.S. Application Data

(60) Provisional application No. 62/447,027, filed on Jan. 17, 2017.

(56) References Cited

U.S. PATENT DOCUMENTS

| | | | |
|---|---|---|---|
| 9,111,780 B2 | 8/2015 | Chuang et al. | |
| 9,209,285 B2 | 12/2015 | Berger | |
| 9,685,559 B2* | 6/2017 | Duan | H01L 29/66742 |
| 2003/0141504 A1* | 7/2003 | Kuwabara | H01L 27/1214 |
| | | | 257/66 |
| 2015/0318401 A1* | 11/2015 | Duan | H01L 29/66742 |
| | | | 250/200 |

OTHER PUBLICATIONS

Stanford et al., "Focused helium-ion beam irradiation effects on electrical transport properties of few-layer WSe2: enabling nanoscale direct write homo-junctions", 2016, Scientific Reports, vol. 6, article 27278, pp. 1-10, published Jun. 6, 2016.*

Na, Junhong, et al., "Few-Layer Black Phosphorus Field-Effect Transistors with Reduced Current Fluctuation," ACS Publications, vol. 8, No. 11; Nov. 4, 2014; pp. 11753-11762 (10).

Buscema, Michele, et al., "Fast and Broadband Photoresponse of Few-Layer Black Phosphorus Field-Effect Transistors," ACS Publications, Nano Lett. 2014, 14; pp. 3347-3352 (6).

* cited by examiner

US 10,236,386 B2

VERTICAL HETERO- AND HOMO-JUNCTION TUNNEL FIELD-EFFECT TRANSISTORS

CROSS-REFERENCE TO RELATED APPLICATIONS

This patent application is a continuation of U.S. patent application Ser. No. 15/835,070, filed on Dec. 7, 2017, and claims the benefit of U.S. Provisional Patent Application No. 62/447,027, filed on Jan. 17, 2017, the entire contents of which are incorporated by reference in their entirety.

BACKGROUND

Power consumption is one of the challenges for future electronics. Reducing the subthreshold swing can reduce the supply voltage and the power consumption. In a conventional MOSFET, the minimum subthreshold swing is 60 mV/decade at room temperature, determined by the thermal energy of the carriers. This can place a limit on the supply voltage.

BRIEF DESCRIPTION OF THE DRAWINGS

The features, objects and advantages other than those set forth above will become more readily apparent when consideration is given to the detailed description below. Such detailed description makes reference to the following drawings, wherein.

Figure 1A:
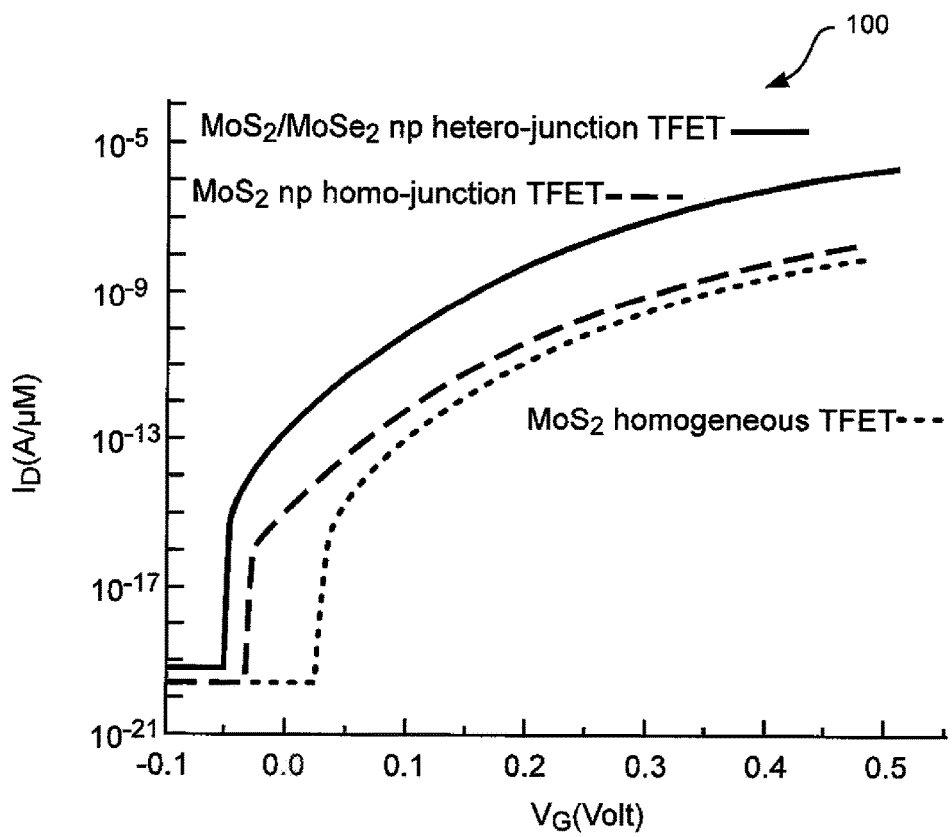
FIG. 1A is a graph of an example simulated $I_D$-$V_G$ curves for homogeneous, np homo-junction, and np hetero junction TFETs.

While the present invention is susceptible to various modifications and alternative forms, exemplary embodiments thereof are shown by way of example in the drawings and are herein described in detail. It should be understood, however, that the description of exemplary embodiments is not intended to limit the invention to the particular forms disclosed, but on the contrary, the intention is to cover all modifications, equivalents and alternatives falling within the spirit and scope of the invention as defined by the embodiments above and the claims below. Reference should therefore be made to the embodiments above and claims below for interpreting the scope of the invention.

DETAILED DESCRIPTION

A device is described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements.

Likewise, many modifications and other embodiments of the device described herein will come to mind to one of skill in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

Unless defined otherwise, all technical and scientific terms used herein have the same meaning as commonly understood by one of skill in the art to which the invention pertains. Although any methods and materials similar to or equivalent to those described herein can be used in the practice or testing of the present invention, the preferred methods and materials are described herein.

In some examples, the systems, methods and/or devices can provide for low power logic, e.g., so that supply voltage needs can be reduced. In some examples, the system, methods and/or devices reduce supply demand of batteries allowing for longer lasting batteries. In some examples, in light of the excessive power dissipation issues plaguing the performance and scalability of integrated circuit (IC) devices, the systems, methods and/or devices provide energy efficient post-CMOS switches. In some examples, tunneling field effect transistor (FET) or (TFET) provide for low power post-CMOS computing. In some examples, the TFETs, and other steep subthreshold slope (SS) systems, methods and/or devices, can provide abrupt switching, e.g., SS~$[V_T$-$V_{G,OFF}]$/log $[I_{ON}/I_{OFF}]$ less than a thermal limit of 60 mV/dec, enabling the reduction of the operating voltage and overall power dissipation. In some examples, TFETs can overcome previous limits by using band-to-band tunneling, rather than thermal injection, to inject charge carriers into the device channel. The systems, methods and/or devices can include a TFET device architecture using group III-V semiconductor, graphene/carbon based materials, and 2D bilayer heterojunction vertical TFET/tunnel diode based on vertical stack of monolayer transition metal dichalcogenides (TMDC).

Figure 1B:
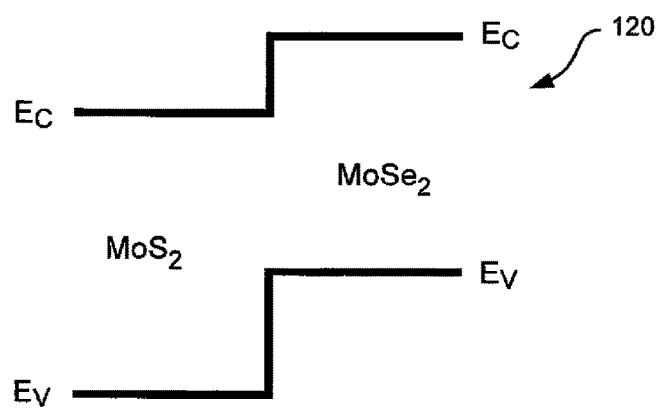
FIG. 1B an example band diagram of $MoS_2$/$MoSe_2$ hetero-junction.
Figure 1C:
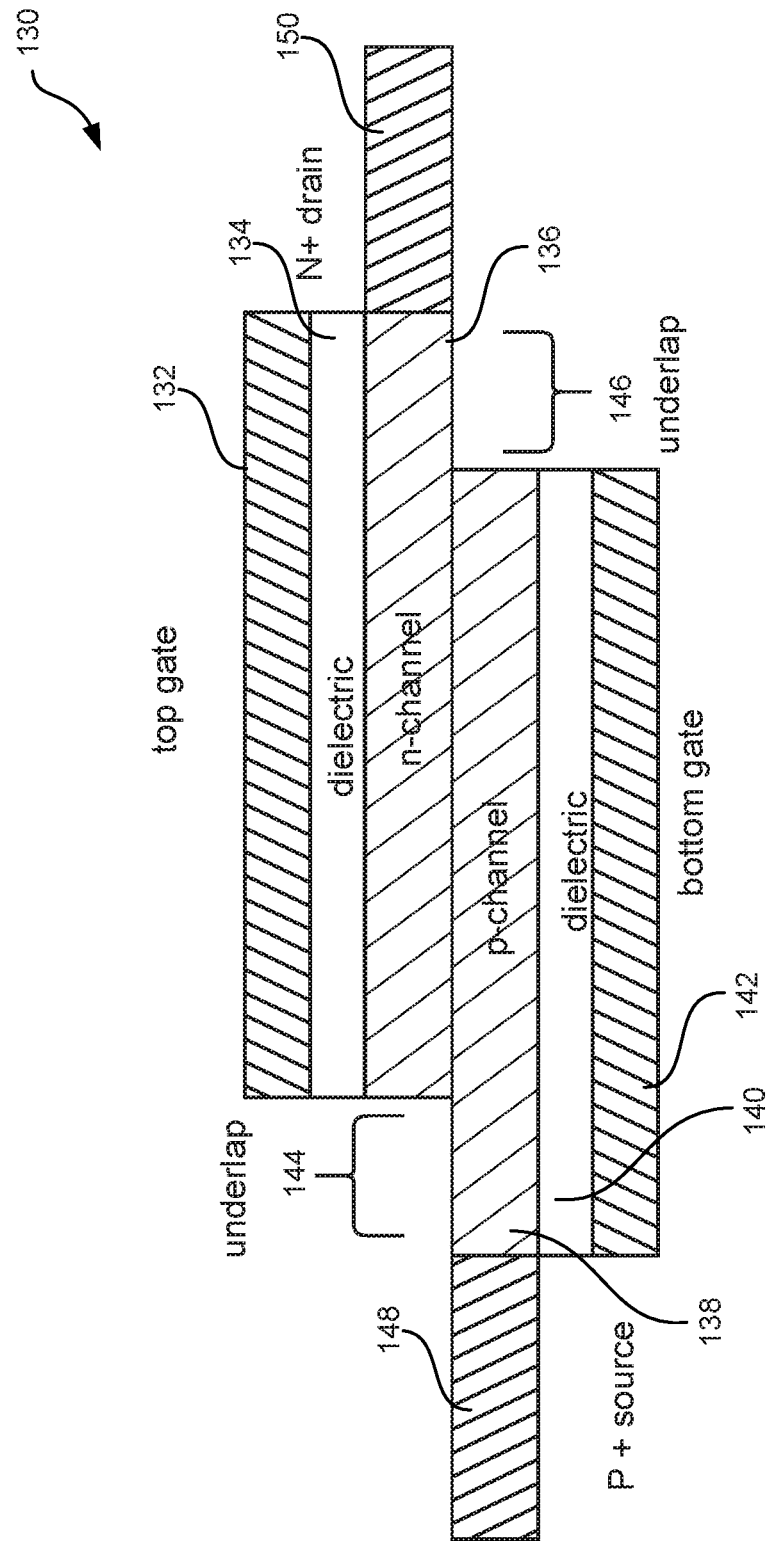
FIG. 1C is a block diagram of an example transistor device structure with $V_G$ sweep applied on top gate.

FIG. 1A is a graph 100 of an example simulated $I_D$-$V_G$ curves for homogeneous, np homo-junction, and np hetero junction TFETs of 5 nm channel thickness. Other thicknesses can be used. FIG. 1B is an example band diagram 120 of Molybdenum disulfide ($MoS_2$)/Molybdenum diselenide ($MoSe_2$) hetero-junction. FIG. 1C is a block diagram of an example transistor device 130, e.g., with VG sweep applied on top gate 132. The transistor device 130 can be used in various industry implementations including, but not limited to, mobile devices, consumer products, medical devices, computers, automotive/transport vehicles, security devices, industrial devices, defense devices, space devices, etc.

The top gate 132 can be deposited in relation to an n-channel layer 136 with a dielectric layer 134 positioned between the top gate 132 and the n-channel layer 136. The re-channel layer 136 can be deposited on a p-channel layer 138 which is deposited in relation to a bottom gate 142, with a dielectric layer 140 positioned between the p-channel layer 138 and the bottom gate 142. The n-channel layer 136 and the p-channel layer 138 can be positioned adjacent to each other. A P+ drain 148 can connect with the p-channel 138 and an N+ drain 150 can connect with n-channel 136. The n-channel 136 can underlap 144 the p-channel 138 by the P+ source 148 to not contact the P+ source 148, and the p-channel 138 can underlap 146 the n-channel by the N+ drain 150 to not contact the N+ drain. The underlaps 144, 146 provide a gap between the top gate 132 and the P+ source 148 and the bottom gate 142 and the N+ drain 150, respectively, of a determined distance to help prevent current leakage from the P+ Source to the n-channel 136, and from the N+ Drain to the p-channel 138, respectively, e.g., to avoid a short circuit. An example underlap is 25 nm, or about 10 nm to about 100 nm. Additionally or alternatively, the gap between the top gate 132 and the P+ source 148 provided by the underlap 144 helps ensure that the top gate 132 only controls the n-channel 136. In some examples, the device 130 can provide a steep slope of the drain with sharp on/off current states at small supply voltages. The n-channel layer 136 and the p-channel layer 138 can include at least one of transition metal dichalcogenides, superlattices of transition metal dichalcogenides, group IV chalcogenides, and superlattices of group IV chalcogenides The device 130 includes stacked, multilayered 2D materials. 2D Materials, sometimes referred to as van der Waal layered materials, include crystalline materials including one or few layers of atoms. 2D materials can generally be categorized as either 2D allotropes of various elements or compounds, including two or more covalently bonding elements. Layered combinations of different 2D materials are generally referred to van der Waals heterostructures. Example 2D materials include, but are not limited to, graphene, transitional metal dichalcogenides, borophene, germanene, silicene, stanine, phosphorene, group IV chalcogenides, metal halides, transition metal oxides, hexagonal boron nitride, borocarbonitrides, and/or MXenes, and their heterostructures. For purposes of explanation, in some examples, the layered 2D materials of the device 130 can include black phosphorus (BP), TMDC (e.g., $MoS_2$ and $MoSe_2$) homo-junction and/or type II (staggered) hetero-junction, layered device 130. In some examples, the multi-layered hetero- (or homo-) devices 130 can be constructed by stacking multiple monolayers of 2D materials on top of each other leading to a sequence of Van der Waal (vdW) bonded layered junctions/superlattice with no interface states. In some examples, the n-channel layer 136 and p-channel layer 138 can include BP, TMDC, and superlattices of TMDCs. In some examples, the n-channel layer 136 includes $MoS_2$ and the p-channel layer 138 includes $MoSe_2$. In some examples, the n-channel layer 136 and the p-channel layer 138 include black phosphorus. In some examples, the n-channel layer 136 and the p-channel layer 138 include $MoS_2$. In some examples, the n-channel layer 136 and the p-channel layer 138 include $MoSe_2$. In some examples, the n-channel layer 136 and the p-channel layer 138 include superlattices of $MoS_2$ and $MoSe_2$. Other examples are possible.

The use of 2D materials for a TFET design the device 130 can provide an atomically thin channel, abrupt pn transition, and free of dangling bonds at the surface, which can lead to excellent electro-static control, and high tunneling current. One advantage of stacking multilayered 2D crystal can include facilitating tuning of electronic bandgap. By selecting the material types and layer thickness of the 2D materials made up of the vdW superlattice heterostructure, direct band gap materials can be engineered to largely enhance drive current hence the performance due to higher tunneling probability of direct interband transitions. The described selection of multilayer stacking can lead to the formation of direct bandgap, hence altering the electronic and optical properties, creating an additional knob to tuning TFET performance, particularly when combined with strain engineering. In some examples, selected material types and layer thicknesses may enhance applicability of TFET devices and overcome low drive currents in existing TFET devices. BP, for example, provides electronic properties in between graphene and TMDC, direct bandgap in both bulk (0.3 eV [15]) and monolayer (2 eV), high mobility, and low dielectric constant. A homojunction of stacked BP does not require layer engineering since BP has direct band gap regardless of the number of layers. As compared to monolayer TMDC, which generally has direct bandgap, a multi-layer TMDC can include higher valley degeneracy and smaller indirect bandgap, with material engineering in forming the 2D vdW superlattice. Using the Synopsys Sentaurus TCAD, an example performance of BP and TMDC multilayer hetero-/homo-junction TFET can be evaluated. A qualitative comparison of example simulated devices is provided with TFET results. In some examples, multilayered BP is advantageous ($I_{on}$>200 µA µm$^{-1}$; avg. SS=24.6 mV/dec) as compared to the TMDC based TFETs, due to its direct narrower bandgap and higher mobility. The multilayered 2D direct gap vdW superlattice TMDC can enhance TMDC TFET performance, e.g., by boosting the drive current to nearly the same level of BP TFET. The components of 2D direct vdW superlattice are not limited to TMDC.

The band-to-band tunneling (BTBT) underlying the TFET operation can be modeled using the dynamic non-local path band-to-band model, implemented in Sentaurus. The model can take into account the nonlocal generation of electrons and holes caused by direct and phonon-assisted BTBT processes. Since relevant tunneling parameters of the simulated 2D multilayer materials are not readily provided in Sentaurus, published results obtained from either experimental data or ab initio theoretical calculations can be used as summarized in Table 1 below.

The bandgap values can be extracted from published GW calculations, a well-established hybrid method that incorporates density functional theory (DFT) with Green's function and is known for correcting the bandgap problem in standard DFT simulation. In some examples, the GW bandgap can be used from Jiang H, "Electronic band structures of molybdenum and tungsten dichalcogenides by the GW approach," J. Phys. Chem. C116 7664-71, 2012 for TMDC, and from Tran V, Soklaski R, Liang Y and Yang L "Layer-controlled band gap and anisotropic excitons in few-layer black phosphorus," Phys. Rev. B 89 235319, 2014 for BP, as they have both demonstrated that their estimated bandgaps are consistent with experimental data. For the BP, the bandgap variation can be computed as a function of layer thickness. Using the data, values can be estimated for the bandgap that correspond to the simulated thickness. In the absence of experimentally verifiable theoretical data for the exact multilayer TMDC thickness considered, bulk-like bandgap values can be adopted from Jiang to model multilayer TMDC since the bandgap for the thickness is determined to be closer to bulk property than monolayer.

For the case of the multilayer TMDCs (with indirect minimal bandgap), the influence of the second and third minimal bandgaps can be included that correspond to the nearby satellite indirect valley (~0.015 eV above the minimum bandgap for both MoS2 and MoSe2) and direct valley (~0.87 eV and ~0.73 eV above the minimum bandgap for MoS2 and MoSe2, respectively) on transport. The same effective masses can be used for both the MoS2 and MoSe2

(Table 1) since the theoretical results show little discrepancy (<10%) between them. In order to take into account the highly anisotropic nature of BP, published inplane effective masses, mx and my, can be used and the average effective mass mxy computed by applying the reciprocal law, $$m_{xy} = \left(\frac{1}{m_x} + \frac{1}{m_y}\right)^{-1},$$

assuming the charges flow equally in x and y directions.

An example structure of the device 130 includes a 75 nm long metal gate (25 nm underlap +50 nm channel overlap) with asymmetric top and bottom work function fabricated on top a 3 nm HfO$_2$ gate dielectric ($\varepsilon_{ox}$=25). The lateral offset between the n- and p- region is adopted to diminish source/drain leakage current. The P+ source 148 and N+ drain 150 contact is doped with 1×10$^{20}$ cm$^{-3}$ boron and arsenic atoms, respectively. The channel can be doped with either: $N_{ch}$=1×10$^{14}$ cm$^{-3}$ (for the homogeneously doped TFET) or $N_D$=$N_A$=1×10$^{18}$ cm$^{-3}$, for both the n-type and p-type homo/hetero-junction TFET. Naturally doped 2D materials of the device 130, e.g., TMDC and/or black phosphorus, can be positioned by each other to provide for atomically sharp transitions from the n to p, to provide for small tunneling and higher on currents. The 2D materials can provide for direct conductivity between valence bands and conduction bands, without any assistance from phonons, e.g., for a high tunneling probability. In some examples, the total channel thickness is about 5 nm, each n-/p- layer 136, 138 is 2.5 nm thick, which corresponds to about five atomic layers. Table 1 provides a summary of the relevant materials parameters. The simulated devices can be calibrated with a 1-D Schrödinger solver to mimic the influence of quantum confinement effect on the device electrostatic using the density gradient model.

TABLE 1

Example parameters for tunneling calculations.

| | $m_{eff}(e)$ | $m_{eff}(h)$ | $E_g(eV)$ | Dielectric constant ($\in_0$) |
|---|---|---|---|---|
| MoS$_2$ | $m_z$ = 100(K), 0.49(Λ) | $m_z$ = 1.73(K), 0.8(Γ) | 1.2(indirect(Λ)), 1.215 (indirect(K)), 2.07 (direct) | 4.8 |
| MoSe$_2$ | $m_{xy}$ = 0.46(K), 0.62(Λ) | $m_{xy}$ = 0.45(K), 0.62(Γ) | 1.1(indirect(Λ)), 1.115 (indirect(K)), 1.83(direct) | 6.9 |
| Black phosphorus | $m_z$ = 0.2, $m_{xy}$ = 0.07 | $m_z$ = 0.4, $m_{xy}$ = 0.1 | 0.8(direct) | 8 |

| Electron affinity | $D_{ac}(eV/m)$ | $\in_{op}$(meV) |
|---|---|---|
| 4.2 | 4.4 × 10$^{10}$ indirect(Λ)) | 14.5(indirect(Λ))23.1 (indirect(K)) |
| 3.92 | 4.8 × 10$^{10}$ (indirect(K)) | 8(indirect(Λ)) 14 (indirect(K)) |
| 4.2 | | No phonons involved |

The graph in FIG. 1A compares an example performance of three TFET devices: homogeneous, np homo-junction, and hetero-junction TFET. In some examples, the np homo-junction TFET provides higher $I_{ON}$ as compared to the uniformly doped homogeneous TFET. This is mainly attributed to the narrower tunneling barrier and sharper transition between n and p region of the np homo-junction device. Additionally, the built-in potential of the np homo-junction leads to lower threshold voltage as compared to the homogeneous TFET. In order to further boost the on-current density, a multi-layer type II heterojunction TMDC TFET with MoS$_2$ can be employed as the n-channel and MoSe$_2$ as the p-channel. The band offsets between MoS$_2$ and MoSe$_2$, bandgap, and dielectric constant of MoSe$_2$ are obtained from published theoretical results on multilayer TMDC (Table 1).

In FIG. 1A, example simulated results indicate that, the on-current of the MoS$_2$/MoSe$_2$ hetero-junction TFET (with identical off-current and thickness) is two orders of magnitudes higher than that of the homogenously doped np homo-junction MoS$_2$ TFETs. The staggered heterojunction provides lower effective barrier height across the n-p junction to facilitate the tunneling process while at the same time maintaining higher bandgap at the channel and source/drain region to mitigate the generation-recombination leakage current. The use of lateral offset (e.g., underlaps 144, 146) between the n-channel layer 136 and p-channel layer 138 (FIG. 1C) can be included for TFET design to suppress the lateral tunneling window along the channel and hence suppressing parasitic leakage current (FIGS. 2A-B).

Figure 2A:
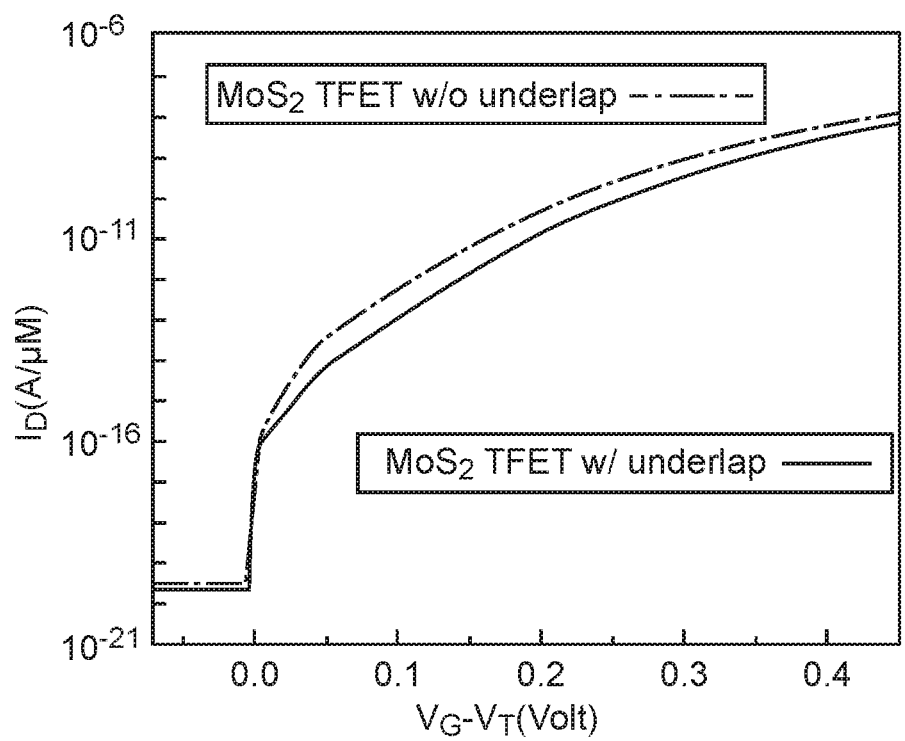
FIGS. 2A-B are graphs of example simulated $I_D$ versus $V_G$-$V_T$ curves of $MoS_2$ and black phosphorus (BP) np homo-junction TFETs with and without underlap, respectively.
Figure 2B:
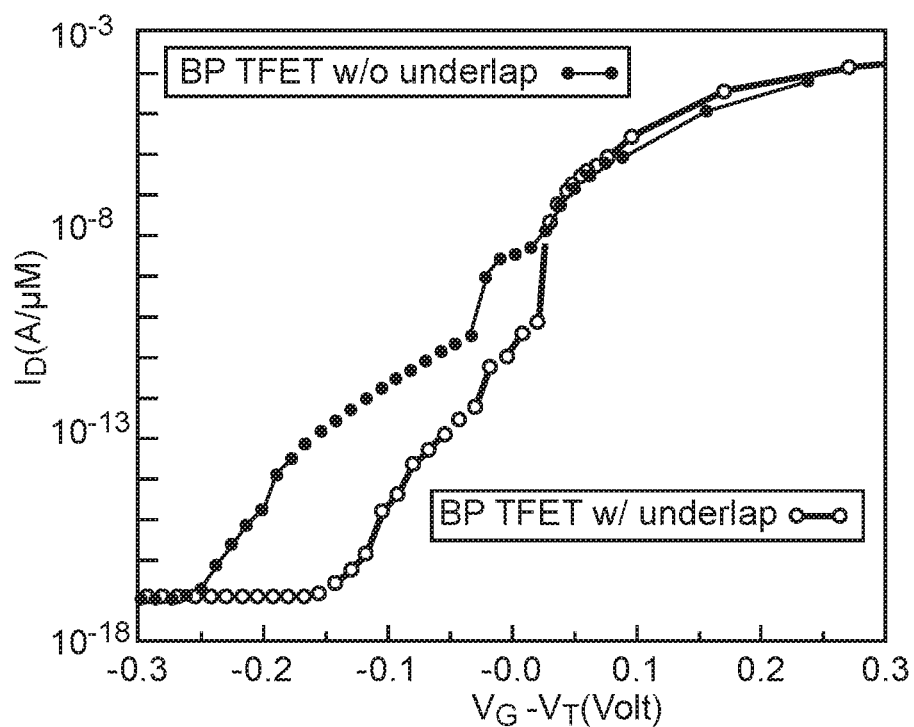

FIGS. 2A-B are graphs of example simulated ID-(VG-VT) curves of MoS$_2$ and BP np homo-junction TFET with and without underlap 144, 146, respectively. To quantify the reduction of current due to underlap 144, 146 region, the example drain current is plotted for both BP and MoS$_2$ with and without the underlap regions 144, 146. The lateral tunneling, due to the absence of the underlap region 144, 146, is more pronounced for the BP case largely due to the lower bandgap of BP (compared to MoS$_2$), hence facilitating the tunneling process.

Figure 3A:
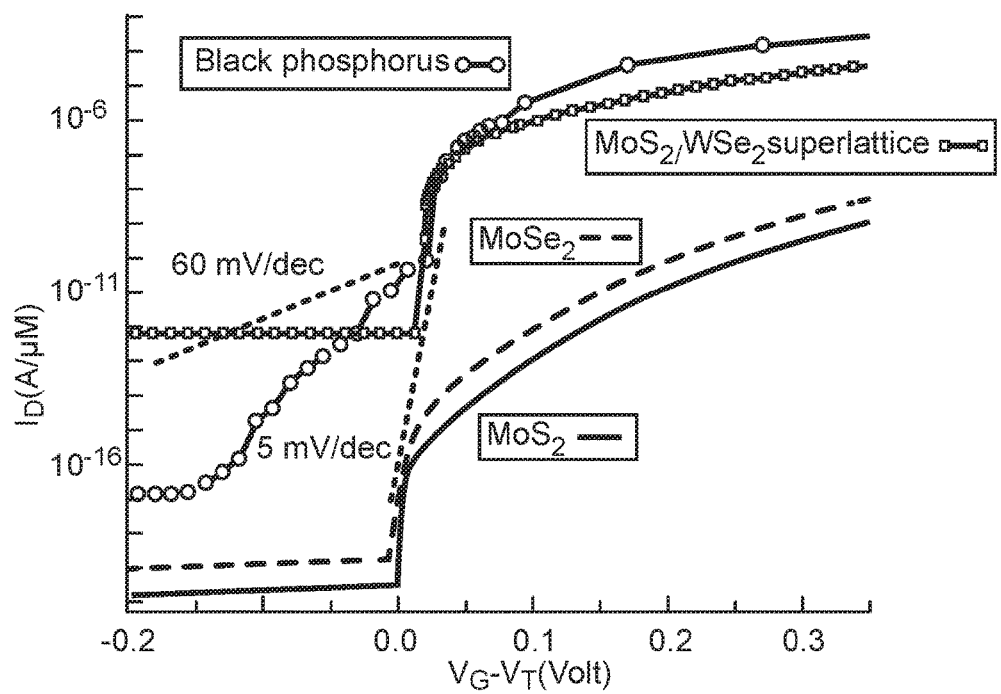
FIG. 3A is graph of an example simulated $I_D$ versus $V_G$-$V_T$ curve for 5 nm np homo-junction TFETs based on $MoS_2$, $MoSe_2$, $MoS_2$/$WSe_2$ superlattice and black phosphorus.
Figure 3B:
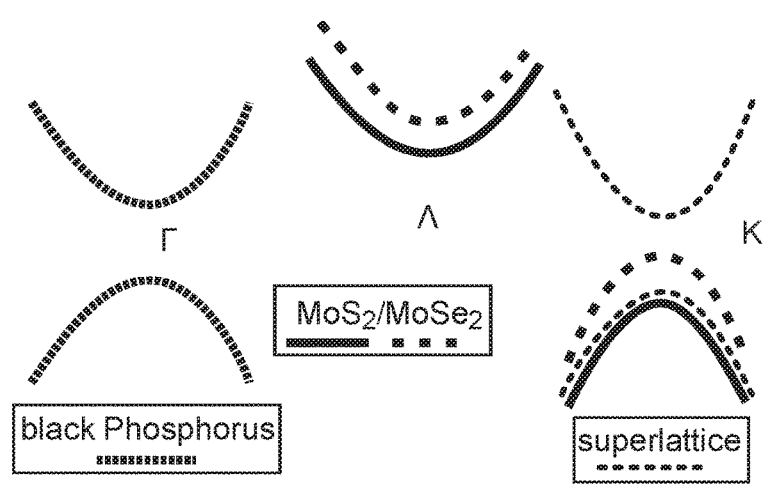
FIG. 3B is a schematic of an example band structure of $MoS_2$, $MoSe_2$, $MoS_2$/$WSe_2$ and black phosphorus materials.

FIG. 3A is graph of an example simulated I versus-$V_G$-$V_T$ curve for 5 nm np homo-junction TFETs based on MoS$_2$, MoSe$_2$, MoS$_2$/WSe$_2$ and black phosphorus. FIG. 3B is a schematic of an example band structure of MoS$_2$, MoSe$_2$, MoS$_2$/WSe$_2$ and black phosphorus materials, for an average SS of black phosphorus TFET of 24.6 mV/dec. In this example, the on-current of the BP (direct bandgap) device is, e.g., 4-5 orders of magnitude higher than the indirect bandgap MoS$_2$ and MoSe$_2$ devices. The BTBT current is generally lower for indirect bandgap materials due to the tunneling transition that can require additional particle, e.g., phonon, to compensate the momentum offset between the conduction and valence bands. A direct bandgap multilayer TMDC-TMDC heterostructure can be manufactured by choosing the ratio of the mono-layers. By modeling the MoS$_2$ and WSe$_2$ as a direct bandgap ($E_g$=0.68 eV) multilayer heterostructure, an increase in current (e.g., >4 orders of magnitude) can be obtained albeit being lower than that of BP due to the differences in effective mass and bandgap. The superlattice can be represented by the gamma curve and the K curve. In some examples, the gamma band does not interfere with the K band due to the higher energy of the gamma band over the K band. Therefore, the electrons can directly tunnel from the valence band in the K valley to the conduction band in the K valley without interference, without interference from the gamma band.

Figure 4:
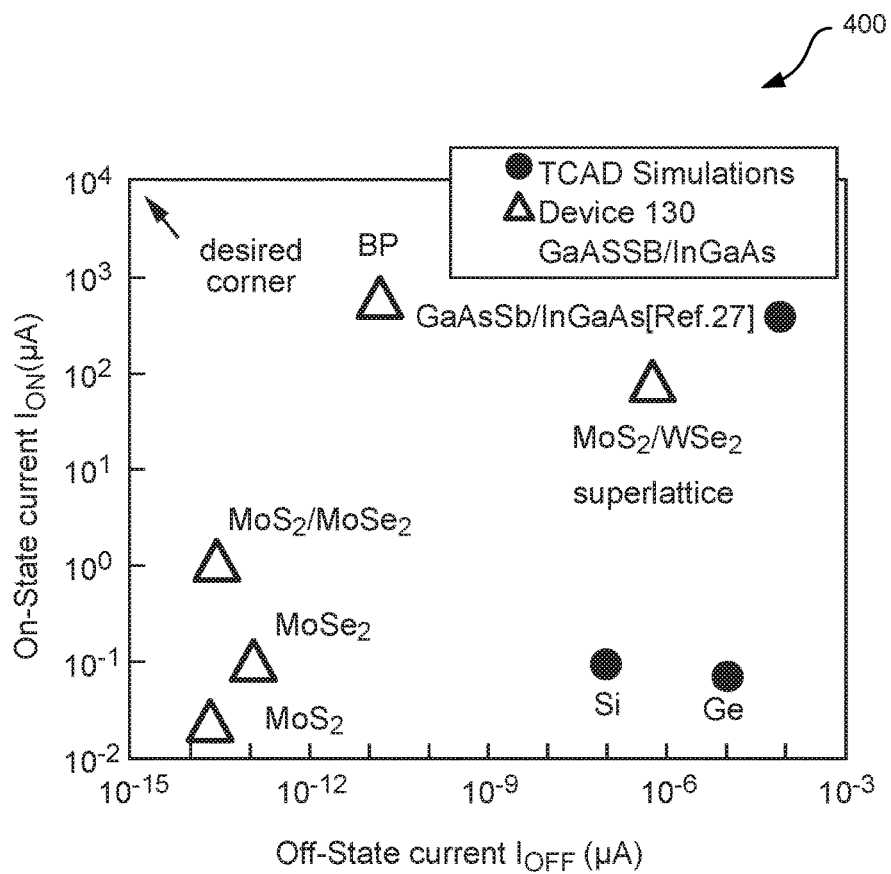
FIG. 4 is a graph of an example benchmarking of BP and transition metal dichalcogenide (TMDC) TFETs with example Si, Ge, and III-V TFETs, based on a TCAD simulation.

FIG. 4 is a graph 400 of an example benchmarking of BP and TMDC TFETs with example Si, Ge, and III-V TFETs, based on a TCAD simulation. The example results are graphed as on-state current versus off-state current. FIG. 4 summarizes the example results compared with reported data (using the Sentaurus TCAD simulations) for silicon (Si), germanium (Ge) homogeneous TFET and III-V heterojunction TFET. The multilayer TMDC to form direct gap vdW superlattice can show an improvement in on-current and a reasonable degradation in off-current. Off-current for the device 130 can be optimized by using the layer thickness to tune the bandgap, and/or using the staggered heterojunction structure.

Figure 5:
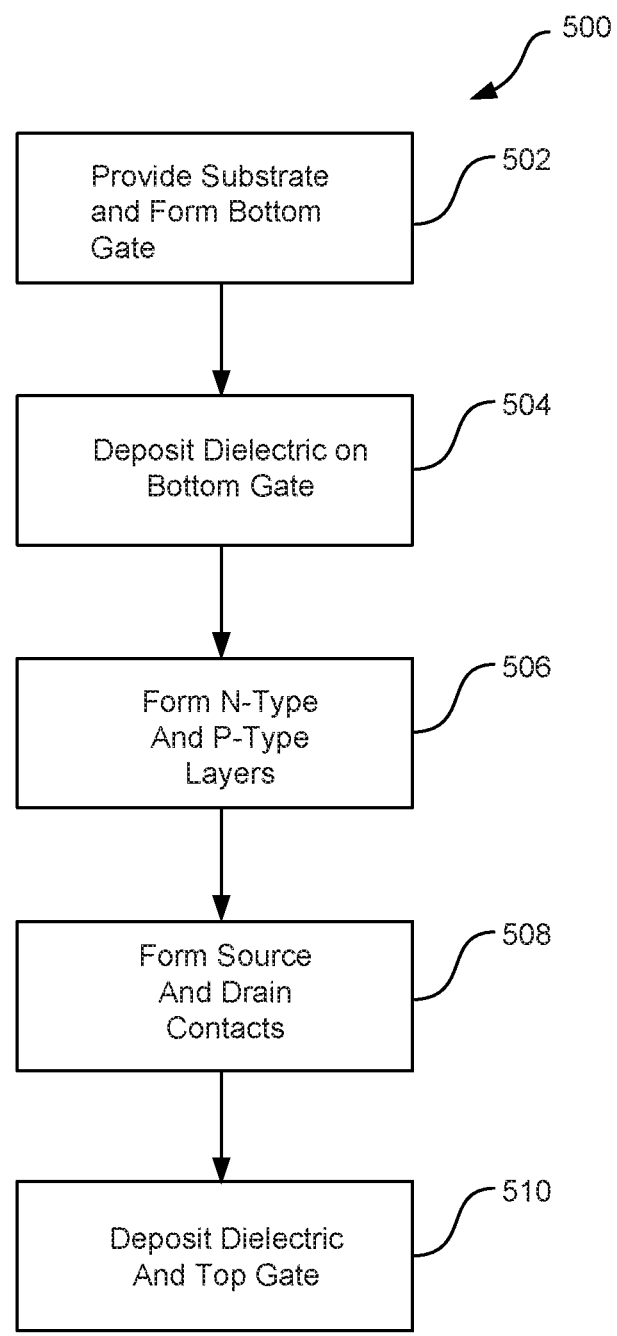
FIG. 5 is a flowchart of an example manufacturing process of the device.

FIG. 5 is a flowchart 500 of an example manufacturing process of the device 130. A substrate, e.g., silicon, can be provided and the bottom gate 142 formed (502). In some examples, the bottom gate 142 can be formed on SiO$_2$/Si substrate by lithography, metal deposition, and lift-off or formed by lithography, silicon oxide reactive ion etching (RIE), metal deposition and chemical mechanical polishing (CMP). An insulator layer 140 is deposited on the bottom gate. The insulator layer can be silicon oxide, silicon nitride, and high-k dielectrics. The dielectric 140 can be deposited on the on the bottom gate 142 (504). The n-type layer and the p-type layers are formed (506). In some examples, two 2D materials are stacked as a p-channel layer 138 and n-channel layer 136 on the insulator layer, e.g., an n-type material and a p-type material, e.g., MoS$_2$ and MoSe$_2$, respectively. The source and drain contacts are formed (508). In some examples, the P+ source 148 is formed connecting to the p-channel 138 and the N+ drain 150 is formed connected to the n-channel 136. The P+ source 148 and the N+ drain 150 can be formed by chemical doping. The metal electrodes are formed on the P+ and N+ region. The metals include but are not limited to titanium, gold, palladium, etc. The dielectric 140 and the top gate 132 are then deposited (510). The dielectrics 134, 140 can include aluminum oxide, hafnium oxide, silicon nitride, etc. The top gate 132 can include a metal, including but not limited to, titanium, gold, palladium, tungsten, nickel, etc.

While various embodiments have been described, it can be apparent that many more embodiments and implementations are possible. Accordingly, the embodiments are not to be restricted.

We claim:

1. A vertical tunneling field effect transistor (TFET), comprising:
   an n-channel layer connected with a drain;
   a p-channel layer connected with a source and stacked on top of or beneath the n-channel layer to provide direct conductivity between the n-channel layer and the p-channel layer and vertical tunneling between the n-channel layer and the p-channel layer;
   a top gate and top gate dielectric on top of the n-channel layer and the p-channel layer; and
   a bottom gate and bottom gate dielectric underneath the n-channel layer and the p-channel layer.

2. The TFET of claim 1, where the n-channel layer comprises MoS$_2$ and the p-channel layer comprises WSe$_2$.

3. The TFET of claim 1, where the n-channel layer and the p-channel layer comprise black phosphorus.

4. The TFET of claim 1, where the n-channel layer and the p-channel layer comprise superlattice of MoS$_2$ and MoSe$_2$.

5. The TFET of claim 1, where the p-channel layer comprises black phosphorus and the n-channel layer comprise transition metal dichalcogenides.

6. The TFET of claim 1, where the n-channel layer and the p-channel layer comprise at least one of transition metal dichalcogenides, superlattices of transition metal dichalcogenides, group IV chalcogenides, and superlattices of group IV chalcogenides.

7. The TFET of claim 1, further including an underlap forming a gap between the n-channel layer and the source.

8. The TFET of claim 1, further including an underlap forming a gap between the p-channel layer and the drain.

9. The TFET of claim 1, further including a sequence of Van der Waal (vdW) bonded layered junctions/superlattice.

10. The TFET of claim 1, where at least one of the p-channel layer and the n-channel layer is doped to reduce contact resistance with at least one of the source and the drain.

11. A method, comprising:
    forming a bottom gate;
    depositing a bottom gate dielectrics;
    forming a p-channel layer;
    forming a n-channel layer on the p-channel layer to provide direct conductivity between the n-channel layer and the p-channel layer and vertical tunneling between the re-channel layer and the p-channel layer;
    forming a top gate dielectric layer;
    forming a top gate; and
    forming the source and drain contacts to connect the n-channel layer and the p-channel layer.

12. The method of claim 11, where the n-channel layer comprises MoS$_2$ and the p-channel layer comprises WSe$_2$.

13. The method of claim 11, where the n-channel layer and the p-channel layer comprise black phosphorus.

14. The method of claim 11, where the n-channel layer and the p-channel layer comprise MoS$_2$.

15. The method of claim 11, where the n-channel layer and the p-channel layer comprise WSe$_2$.

16. The method of claim 11, where one of the p-channel layer comprise black phosphorus and the n-channel layer comprise transition metal dichalcogenides.

17. The method of claim 11, where the n-channel layer and the p-channel layer comprise at least one of transition metal dichalcogenides, superlattices of transition metal dichalcogenides, group IV chalcogenides, and superlattices of group IV chalcogenides.

18. The method of claim 11, further including providing a sequence of Van der Waal (vdW) bonded layered junctions/superlattice.

19. The method of claim 11, further including providing a source connected with the p-channel layer and a drain connected with the n-channel layer.

20. The method of claim 19, further including providing an underlap forming a gap between the n-channel layer and the source.

21. The method of claim 19, further including providing an underlap forming a gap between the p-channel layer and the drain.

22. The method of claim 19, further including doping at least one of the p-channel layer and the n-channel layer to reduce contact resistance with at least one of the source and the drain.

* * * * *